(12) United States Patent
Liu et al.

(10) Patent No.: US 9,013,240 B2
(45) Date of Patent: Apr. 21, 2015

(54) CIRCUIT, DEVICE AND METHOD IN A CIRCUIT

(71) Applicant: Beken Corporation, Shanghai (CN)

(72) Inventors: Jiazhou Liu, Shanghai (CN); Dawei Guo, Shanghai (CN)

(73) Assignee: Beken Corporation, Shanghai (CN)

( * ) Notice: Subject to any disclaimer, the term of this patent is extended or adjusted under 35 U.S.C. 154(b) by 0 days.

(21) Appl. No.: 14/194,676

(22) Filed: Mar. 1, 2014

(65) Prior Publication Data

US 2015/0035610 A1 Feb. 5, 2015

(30) Foreign Application Priority Data

Aug. 5, 2013 (CN) .......................... 2013 1 0338350

(51) Int. Cl.
| | | |
|---|---|---|
| *G01R 23/15* | (2006.01) | |
| *H03B 5/32* | (2006.01) | |
| *H03K 3/0231* | (2006.01) | |
| *H03K 5/125* | (2006.01) | |
| *H04B 1/16* | (2006.01) | |
| *H03L 7/24* | (2006.01) | |

(52) U.S. Cl.
CPC *H03L 7/24* (2013.01); *H03K 5/125* (2013.01); *H03B 5/32* (2013.01); *H03K 3/0231* (2013.01); *H04B 1/1638* (2013.01); *G01R 23/155* (2013.01)

(58) Field of Classification Search
CPC ...... G01R 23/00; G01R 23/005; G01R 23/02; G01R 23/10; G01R 23/15; G01R 23/155; H03B 5/30; H03B 5/32; H03K 3/0231; H03K 3/354; H03K 5/125; H03K 5/26; H03L 7/00; H03L 7/24; H04B 1/16; H04B 1/1638
USPC .......... 327/39–42, 44–48; 331/18, 44, 46, 47, 331/111, 143, 145, 149, 153, 154, 158, 172, 331/173
See application file for complete search history.

(56) References Cited

U.S. PATENT DOCUMENTS

| | | | | |
|---|---|---|---|---|
| 3,713,149 | A * | 1/1973 | Bruner et al. ................... | 342/88 |
| 5,659,884 | A * | 8/1997 | Daughtry et al. ............... | 455/75 |
| 2002/0173284 | A1 * | 11/2002 | Forrester ....................... | 455/255 |
| 2010/0295623 | A1 * | 11/2010 | Gronemeyer ................... | 331/44 |
| 2013/0321048 | A1 * | 12/2013 | He ............................... | 327/156 |

* cited by examiner

*Primary Examiner* — Levi Gannon
(74) *Attorney, Agent, or Firm* — Perkins Coie LLP

(57) ABSTRACT

A method in a circuit comprises providing a first clock by a resistor-capacitor (RC) oscillator; demodulating a plurality of input signals to form a plurality of demodulated input signals; discriminating frequency ranges of the plurality of demodulated input signals according to the first clock; determining whether a first predetermined number of consecutive demodulated input signals among the plurality of demodulated input signals fall into a first predetermined frequency range; triggering a crystal oscillator to provide a second clock to calibrate the first clock if the first predetermined number of consecutive input signals fall into the first predetermined frequency range.

17 Claims, 4 Drawing Sheets

CIRCUIT, DEVICE AND METHOD IN A CIRCUIT

CLAIM OF PRIORITY

This application claims priority to Chinese Application No. 201310338350.4 entitled "CIRCUIT, DEVICE AND METHOD IN A CIRCUIT", filed on Aug. 5, 2013 by Beken Corporation, which is incorporated herein by reference.

TECHNICAL FIELD

The present application relates to a circuit, a device and a method, and more particularly but not exclusively to a triggering circuit, device and method.

BACKGROUND

Electronic Toll Collection (ETC) systems enable drivers to pay road tolls without stopping their vehicles. An ETC system is especially useful for highways, bridges and tunnels with heavy traffic.

A Road Side Unit (RSU) broadcasts wireless signals at a certain frequency, such as 14 KHz square waves modulated by 5.83 GHz or 5.84 GHz carrier waves according to a standard (e.g., national standard of China).

An On Board Unit (OBU) uses a wake-up circuit, which will wake up the primary circuit in the OBU when one or more preset conditions are met, for example when the OBU detects the 14 KHz square wave transmitted by the RSU.

The On Board Unit (OBU) comprises a Resistor-Capacitor (RC) oscillator. The RC oscillator is sensitive to environment conditions, and the RC oscillator will shift. Therefore the RC oscillator may need to be calibrated from time to time.

SUMMARY OF THE INVENTION

According to an embodiment of the invention, a circuit is provided. The circuit comprises a demodulator, a resistor-capacitor (RC) oscillator, a frequency discriminator, a controller and a crystal oscillator. The demodulator is configured to demodulate a plurality of input signals to form a plurality of demodulated input signals. The resistor-capacitor (RC) oscillator is configured to provide a first clock to a frequency discriminator. The frequency discriminator is configured to discriminate frequency ranges of the plurality of demodulated input signals according to the first clock. The controller is configured to determine whether at least a first predetermined number of consecutive demodulated input signals among the plurality of demodulated input signals fall into a first predetermined frequency range. The controller is further configured to trigger the crystal oscillator to provide a second clock to calibrate the RC oscillator if at least the first predetermined number of consecutive demodulated input signals fall into the first predetermined frequency range.

According to another embodiment of the invention, there is provided a device. The device comprises a means for demodulating a plurality of input signals to form a plurality of demodulated input signals; a means for providing a first clock; a means for discriminating frequency ranges of the plurality of demodulated input signals according to the first clock; a means for determining whether at least a first predetermined number of consecutive demodulated input signals among the plurality of demodulated input signals fall into a first predetermined frequency range; wherein the means for determining is further for triggering a crystal oscillator to provide a second clock to calibrate the means for providing the first clock if at least the first predetermined number of consecutive demodulated input signals fall into the first predetermined frequency range.

According to another embodiment of the present invention, a method in a circuit is disclosed. The method comprises providing a first clock by a resistor-capacitor (RC) oscillator; demodulating a plurality of input signals to form a plurality of demodulated input signals; discriminating frequency ranges of the plurality of demodulated input signals according to the first clock; determining whether at least a first predetermined number of consecutive demodulated input signals among the plurality of demodulated input signals fall into a first predetermined frequency range; triggering a crystal oscillator to provide a second clock to calibrate the first clock if at least the first predetermined number of consecutive input signals fall into the first predetermined frequency range.

In this embodiment, when at least the first predetermined number of consecutive demodulated input signals fall into the first predetermined frequency range, it indicates that clock generated by the RC oscillator drifts and is no longer accurate. Then the crystal oscillator will be triggered to output a second clock, and the first clock generated by the resistor-capacitor (RC) synchronizes with the second clock generated the crystal oscillator. As the second clock generated by the crystal oscillator is accurate, the first clock generated by the resistor-capacitor will be calibrated.

Alternatively, the method further comprises waking up an on board unit (OBU) if at least a second predetermined number of consecutive demodulated input signals fall into a second predetermined frequency range.

In this embodiment, when at least the second predetermined number of consecutive demodulated input signals fall into a second predetermined frequency range, it indicates that a wakeup signal, such as the 14 KHz square waves has been detected, so that the OBU is waked up.

Alternatively, the method further comprises ceasing triggering the crystal oscillator when the RC oscillator has been calibrated.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Figure 1:
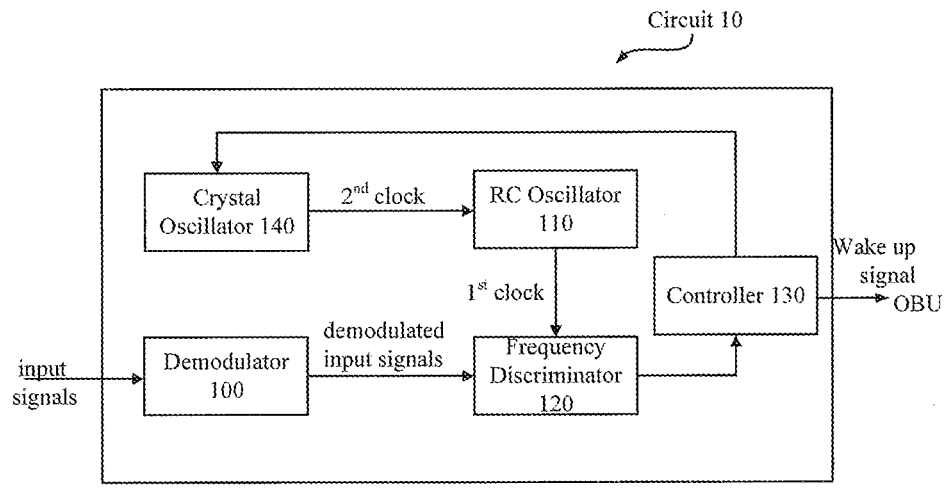
FIG. 1 is a diagram illustrating a circuit 10 according to an embodiment of the invention.

Various aspects and examples of the invention will now be described. The following description provides specific details for a thorough understanding and enabling description of these examples. Those having ordinary skill in the art will understand, however, that the invention may be practiced without many of these details. Additionally, some well- FIG. 1 is a diagram illustrating a circuit 10 according to an embodiment of the invention. The circuit 10 comprises a demodulator 100, a resistor-capacitor (RC) oscillator 110, a frequency discriminator 120, a controller 130 and a crystal oscillator 140. The demodulator 100 demodulates a plurality of input signals to form a plurality of demodulated input signals. The resistor-capacitor (RC) oscillator 110 provides a first clock to the frequency discriminator 120. The frequency discriminator 120 discriminates frequency ranges of the plurality of demodulated input signals according to the first clock. The controller 130 determines whether at least a first predetermined number of consecutive demodulated input signals among the plurality of demodulated input signals fall into a first predetermined frequency range. The first predetermined frequency range will be discussed further below in conjunction with FIG. 2. The controller 130 further triggers the crystal oscillator 140 to provide a second clock to calibrate the RC oscillator 110 if at least the first predetermined number of consecutive demodulated input signals fall into the first predetermined frequency range. The first predetermined number equals three in an embodiment of the invention. However those having ordinary skill in the art can appreciate that the first predetermined number may be different and have values other than three.

Alternatively, the controller 130 is further configured to output a wake up signal to an on board unit (OBU) if at least a second predetermined number of consecutive demodulated input signals fall into a second predetermined frequency range. The second predetermined frequency range will be discussed further below in conjunction with FIG. 2. The second predetermined number equals three in an embodiment of the invention. However those having ordinary skill in the art can appreciate that the second predetermined number may be different and have values other than three.

Alternatively, the crystal oscillator 140 is configured to be closed when the RC oscillator 110 has been calibrated.

The circuit 10 is located in the OBU. In order to reduce power consumption, normally the OBU is in a sleep mode. When the OBU receives a predetermined signal, for example, a wireless signal at a predetermined frequency, such as a 14 KHz square wave, the OBU will wake up from sleep mode and enter a working mode. The frequency discriminator 120 in the OBU is typically used to detect the existence of the predetermined signal. The RC oscillator 110 provides the first clock as a reference clock for the frequency discriminator 120, so that the frequency discriminator 120 can compare the input signal with the first clock to determine whether the predetermined signal is received. For example, the RC oscillator 110 provides a 14 KHz square clock to the frequency discriminator 120 such that the frequency discriminator 120 can compare the demodulated input signals with the first clock signal, and discriminate whether the demodulated input signals is a 14 kHz square clock.

It is known that the frequency provided by the RC oscillator 110 can be represented by $$f = \frac{1}{2\pi RC},$$

and RC is also represented as the time constant τ. However, as τ is sensitive to environment conditions, for example temperature, the RC oscillator 110 is also sensitive to environmental conditions, for example temperature. For example, the first clock generated by the RC oscillator 110 may shift from 14 KHz with a change of temperature. Therefore, it is possible that the time constant τ of the RC oscillator 110 calibrated for room temperature may offset when the RC oscillator 110 is used in a higher or lower temperature, which may lead to failure to detect the predetermined signal, thus failing to wake up the OBU. Therefore the RC oscillator 110 may need to be calibrated from time to time. The embodiment of the invention solves the technical problem of how to detect that the first clock generated by the RC oscillator 110 is no longer accurate and the RC oscillator 110 needs to be calibrated. In other word, how to trigger auto-calibration of the RC oscillator. With the auto-calibration function of the embodiments of the present invention, no additional current is needed to sense the change of the RC oscillator in response to the change of environment. Therefore, embodiments of the present invention are suitable to application scenarios for low power consumption.

Figure 1A:
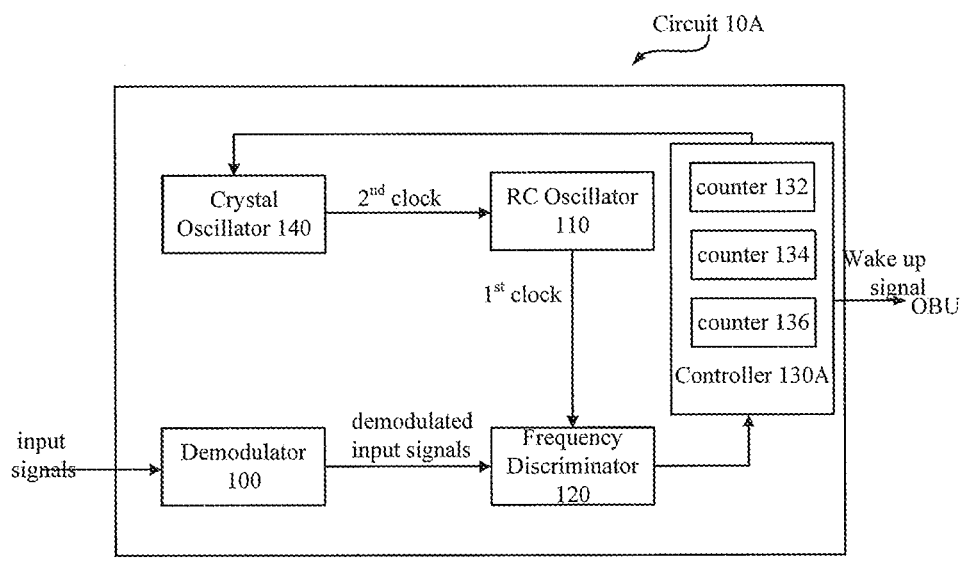
FIG. 1A is a diagram illustrating a circuit 10A according to another embodiment of the invention.

FIG. 1A is a diagram illustrating a circuit 10A according to another embodiment of the invention. In FIG. 1A, same or similar reference signs represent same or similar parts, of which the description is omitted for simplicity. The controller 130A further comprises at least three counters 132, 134 and 136. Each of the counters 132, 134 and 136 is configured to count the consecutive number of signals that fall into the respective first or second frequency range. The first predetermined frequency range and the second predetermined frequency range will be discussed further below in conjunction with FIG. 2.

Figure 2:
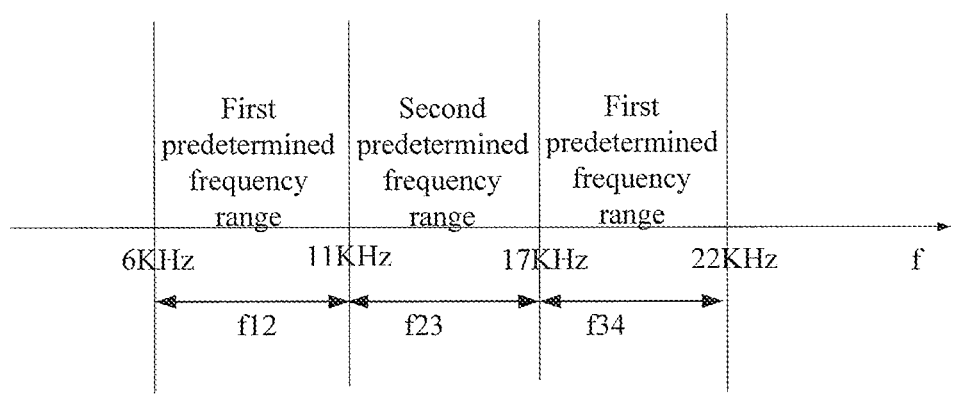
FIG. 2 is a diagram illustrating a first predetermined frequency range and a second predetermined frequency range.

FIG. 2 is a diagram illustrating a first predetermined frequency range and a second predetermined frequency range. As shown in FIG. 2, the first predetermined frequency range ranges from about 6 kHz to about 11 kHz, which is shown as f12. Alternatively, the first predetermined frequency range may range froth about 17 kHz to about 22 kHz, which is shown as f34. FIG. 2 further shows a second predetermined frequency range that ranges from about 11 kHz to about 17 kHz, which is shown as f23. Those having ordinary skill in the art should appreciate that the range of the first predetermined frequency range and the range of the second predetermined frequency range can be varied according to different application scenarios of embodiments of the invention.

Referring back to FIG. 1A in conjunction with FIG. 2, for example, the counter 132 is used to count the number of the consecutive signals that fall into the first predetermined frequency range of f12, the counter 134 is used to count the number of the consecutive signals that fall into the second predetermined frequency range of f23, and the counter 136 is used to count the number of the consecutive signals that fall into another first predetermined frequency range of f34. Initially, the counters 132, 134 and 136 are all set to zero. If at first a signal within range f12 is detected, then the counter 132 increments by 1. Then if a signal within range f23 is detected, then the counter 134 increments by 1, and the counter 132 is reset to 0. If a subsequent signal is detected to be within range f23, then the counter 134 further increments by 1. However, when a signal is detected to be beyond the range f23, then the number of the counter 134 is reset to zero. When a second predetermined number of the consecutive signals are detected to be within the range f23, the controller 130A outputs a wakeup signal to wake up the OBU. However, when a first predetermined number of consecutive signals are detected to be within the first predetermined range of f12, then the controller 130A triggers the crystal oscillator 140 to provide a second clock to calibrate the RC oscillator 110. Alternatively, when a first predetermined number of consecutive signals are detected to be within the first predetermined range of f34, the controller 130A triggers the crystal oscillator 140 to provide a second clock to calibrate the RC oscillator 110. It should also be appreciated that if the signals are detected to be randomly spread in the three ranges, and the number of consecutive signals that fall into range f12 is less than the first predetermined number, and the number of consecutive signals that fall into range f34 is less than the first predetermined number, then these signals are considered as interference signals, and will not trigger calibration of the RC oscillator 110. However, if the number of consecutive demodulated input signals equal or exceed the first predetermined number for example, it indicates that the RC oscillator 110 has shifted and needs to be calibrated.

Both the first predetermined number and the second predetermined number equals three in an embodiment of the invention. However those having ordinary skill in the art can appreciate that the first predetermined number and the second predetermined number may be different and have values other than three.

Figure 3:
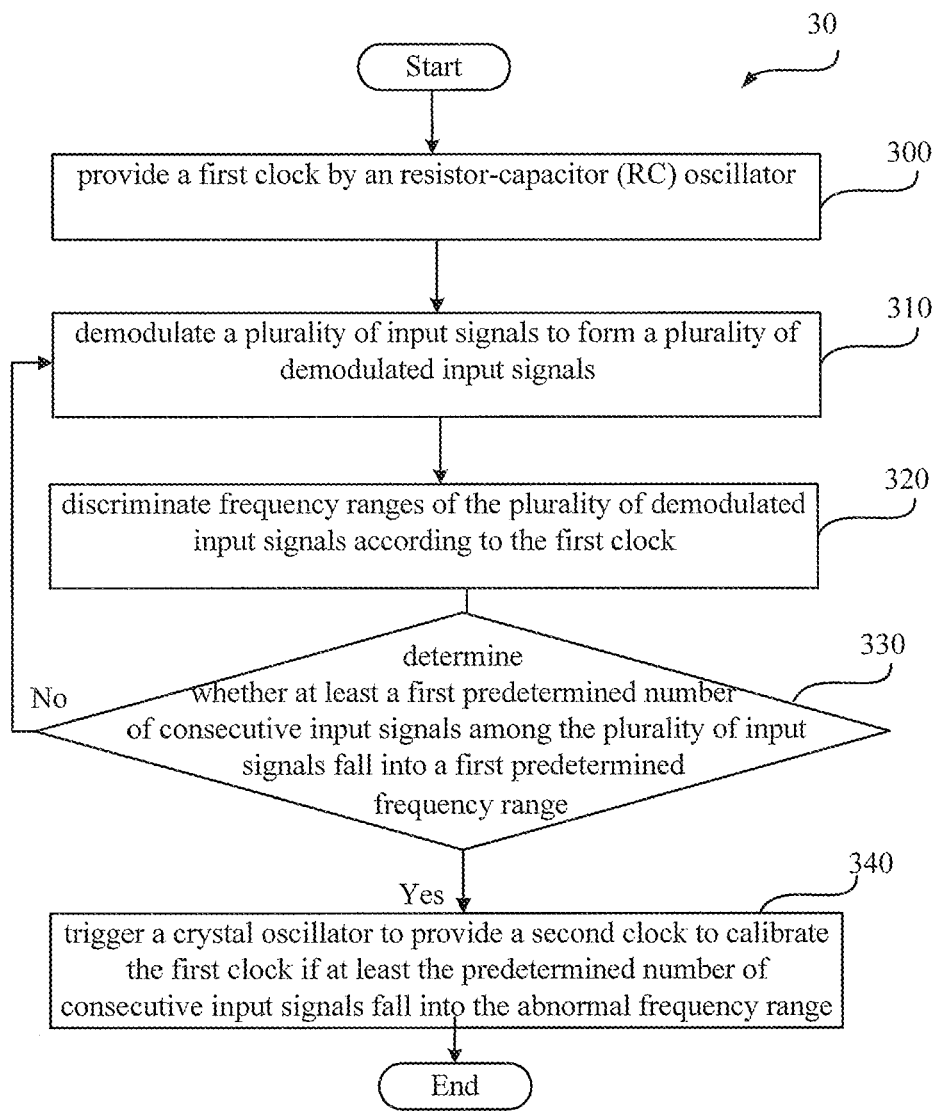
FIG. 3 is a flowchart illustrating a method according to an embodiment of the invention.

FIG. 3 is a flowchart illustrating a method 30 according to an embodiment of the invention.

The method 30 comprises providing (in block 300) a first clock by a resistor-capacitor (RC) oscillator, demodulating (in block 310) a plurality of input signals to form a plurality of demodulated input signals; discriminating (in block 320) frequency ranges of the plurality of demodulated input signals according to the first clock; determining (in block 330) whether at least a first predetermined number of consecutive demodulated input signals among the plurality of demodulated input signals fall into a first predetermined frequency range; and triggering (in block 340) a crystal oscillator to provide a second clock to calibrate the first clock if at least the first predetermined number of consecutive input signals fall into the first predetermined frequency range (that is the determining result of block 330 is Yes). If the block 330 determines NO, then the method 30 return to block 310.

Figure 3A:
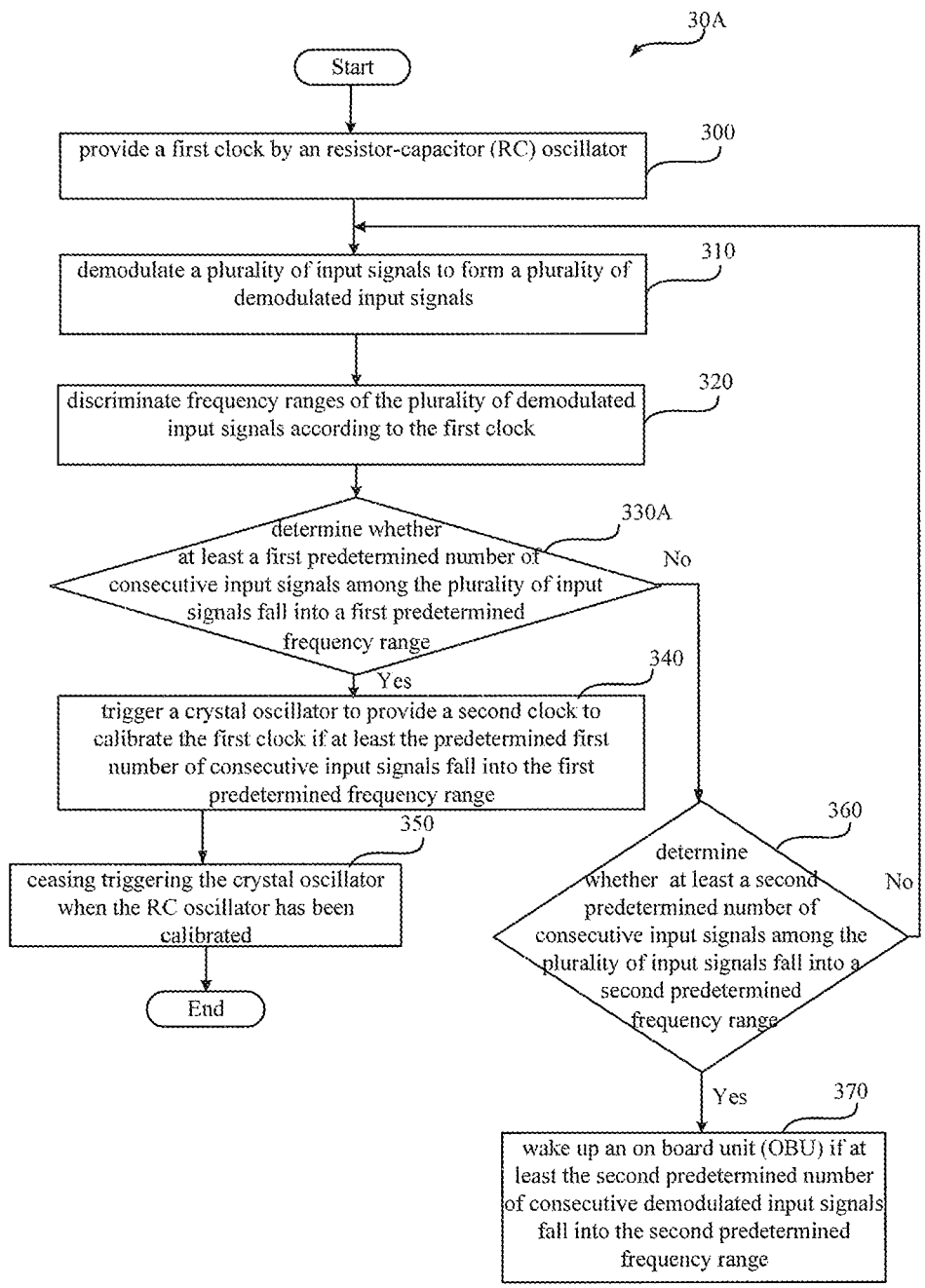
FIG. 3A is a flowchart illustrating a method according to an embodiment of the invention.

FIG. 3A is a flowchart illustrating a method 30A according to another embodiment of the present invention. Same reference signs refer to same blocks, of which descriptions are omitted for simplicity. If the determining result of block 330A in method 30A is YES, then the method 30A enters 340. The method 30A further comprises ceasing (in block 350) triggering the crystal oscillator when the RC oscillator has been calibrated. If the determining result of block 330A is NO, then the method enters block 360, determining (in block 360) whether at least a second predetermined number of consecutive input signals among the plurality of input signals fall into a second predetermined frequency range. If the determining result of block 360 is YES, then the method 30A enters waking up (in block 370) an on board unit (OBU) if at least the second predetermined number of consecutive demodulated input signals fall into a second predetermined frequency range. If the determining result of block 360 is No, then the method 30A returns to block 310. It should be appreciated by those having ordinary skill in the art that the sequence is for illustrative purpose only. For example, block 330A and block 360 do not have to be performed in order recited in FIG. 3A. In other words, block 330A and block 360 can be implemented substantially simultaneously or in different orders.

It should be appreciated by those having ordinary skill in the art that components from different embodiments may be combined to yield another technical solution. This written description uses examples to disclose the invention, including the best mode, and also to enable any person having ordinary skill in the art to practice the invention, including making and using any devices or systems and performing any incorporated methods. The patentable scope of the invention is defined by the claims, and may include other examples that occur to those having ordinary skill in the art. Such other examples are intended to be within the scope of the claims if they have structural elements that do not differ from the literal language of the claims, or if they include equivalent structural elements with insubstantial differences from the literal languages of the claims.

What is claimed is:

1. A circuit, comprising:
   a demodulator configured to demodulate a plurality of input signals to form a plurality of demodulated input signals;
   a resistor-capacitor (RC) oscillator configured to provide a first clock to a frequency discriminator;
   the frequency discriminator is configured to discriminate frequency ranges of the plurality of demodulated input signals according to the first clock;
   a controller configured to determine whether at least a first predetermined number of consecutive demodulated input signals among the plurality of demodulated input signals fall into a first predetermined frequency range;
   a crystal oscillator;
   wherein the controller is further configured to trigger the crystal oscillator to provide a second clock to calibrate the RC oscillator if at least the first predetermined number of consecutive demodulated input signals fall into the first predetermined frequency range.

2. The circuit of claim 1, wherein:
   the controller is further configured to
      determine whether at least a second predetermined number of consecutive demodulated input signals fall into a second predetermined frequency range; and
      output a wake up signal to an on board unit (OBU) if at least the second predetermined number of consecutive demodulated input signals fall into the second predetermined frequency range.

3. The circuit of claim 1, wherein the crystal oscillator is configured to be closed when the RC oscillator has been calibrated.

4. The circuit of claim 1, wherein the first predetermined frequency range ranges from about 6 kHz to about 11 kHz.

5. The circuit of claim 1, wherein the first predetermined frequency range ranges from about 17 kHz to about 22 kHz.

6. The circuit of claim 2, wherein the second predetermined frequency range ranges from about 11 kHz to about 17 kHz.

7. The circuit of claim 1, wherein the first predetermined number equals three.

8. The circuit of claim 2, wherein the second predetermined number equals three.

9. A device, comprising:
   a means for demodulating a plurality of input signals to form a plurality of demodulated input signals;
   a means for providing a first clock;
   a means for discriminating frequency ranges of the plurality of demodulated input signals according to the first clock;
   a means for determining whether a first predetermined number of consecutive demodulated input signals among the plurality of demodulated input signals fall into a first predetermined frequency range;
   wherein the means for determining is further for triggering a means for providing a second clock to provide the second clock to calibrate the means for providing the first clock if the first predetermined number of consecutive demodulated input signals fall into the first predetermined frequency range.

10. A method in a circuit, comprising:

providing a first clock by a resistor-capacitor (RC) oscillator;

demodulating a plurality of input signals to form a plurality of demodulated input signals;

discriminating frequency ranges of the plurality of demodulated input signals according to the first clock;

determining whether at least a first predetermined number of consecutive demodulated input signals among the plurality of demodulated input signals fall into a first predetermined frequency range;

triggering a crystal oscillator to provide a second clock to calibrate the first clock if at least the first predetermined number of consecutive input signals fall into the first predetermined frequency range.

11. The method of claim 10, further comprising:

determining whether at least a second predetermined number of consecutive demodulated input signals fall into a second predetermined frequency range; and waking up an on board unit (OBU) if at least the second predetermined number of consecutive demodulated input signals fall into the second predetermined frequency range.

12. The method of claim 10, further comprising:

ceasing triggering the crystal oscillator when the RC oscillator has been calibrated.

13. The method of claim 10, wherein the first predetermined frequency range ranges from about 6 kHz to about 11 kHz.

14. The method of claim 10, wherein
the first predetermined frequency range ranges from about 17 kHz to about 22 kHz.

15. The method of claim 11, wherein the second predetermined frequency range ranges from about 11 kHz to about 17 kHz.

16. The method of claim 10, wherein the first predetermined number equals three.

17. The method of claim 11, wherein the second predetermined number equals three.

* * * * *